United States Patent [19]

Woo et al.

[11] Patent Number: 5,451,543
[45] Date of Patent: Sep. 19, 1995

[54] STRAIGHT SIDEWALL PROFILE CONTACT OPENING TO UNDERLYING INTERCONNECT AND METHOD FOR MAKING THE SAME

[75] Inventors: Michael P. Woo; Robert P. Chebi; James D. Hayden, all of Austin, Tex.

[73] Assignee: Motorola, Inc., Schaumburg, Ill.

[21] Appl. No.: 233,108

[22] Filed: Apr. 25, 1994

[51] Int. Cl.⁶ .............................. H01L 21/44
[52] U.S. Cl. ........................ 437/195; 437/190
[58] Field of Search ....................... 437/190, 195

[56] References Cited

U.S. PATENT DOCUMENTS

| | | | |
|---|---|---|---|
| 4,943,539 | 7/1990 | Wilson et al. | 437/195 |
| 4,948,459 | 8/1990 | Laarhoven et al. | 156/643 |
| 4,965,226 | 10/1990 | Gootzen et al. | 437/189 |
| 4,966,870 | 10/1990 | Barber et al. | 437/228 |
| 5,328,553 | 7/1994 | Poon | 437/195 |
| 5,371,047 | 10/1992 | Greco et al. | 437/195 |
| 5,385,867 | 1/1995 | Ueda et al. | 437/195 |
| 5,399,235 | 3/1995 | Mutsaers et al. | 437/195 |

FOREIGN PATENT DOCUMENTS 3233254 1/1991 Japan.

*Primary Examiner*—Brian E. Hearn
*Assistant Examiner*—Lynne A. Gurley
*Attorney, Agent, or Firm*—Minh-Hien N. Clark

[57] ABSTRACT

A method for making a vertical profile contact opening (18) uses an etch stop layer (14), interposed between a conductor layer (10) and a dielectric layer (16), to eliminate resputtering of the underlying conductor material which prevents tapering of the etched opening (18). This contact opening formation is accomplished using different etchant chemistries, etching one film selective to the other. The use of the etch stop material in conjunction with conventional interconnect structures allows multiple stacking of contact features or multilevel interconnects to be achieved independent of underlying topography without increasing overall contact/via resistance. The method allows the fabrication of an unlanded via structure (30) having substantially vertical sidewall profile.

5 Claims, 5 Drawing Sheets

STRAIGHT SIDEWALL PROFILE CONTACT OPENING TO UNDERLYING INTERCONNECT AND METHOD FOR MAKING THE SAME

FIELD OF THE INVENTION

The present invention relates to an opening to an interconnect and methods for its fabrication generally, and more specifically to a contact opening having a substantially vertical sidewall profile and methods for making the same.

BACKGROUND OF THE INVENTION

As semiconductor device dimensions approach the sub-half-micron level, one of the limiting factors for further reduction in size is the area required for device interconnections. One solution has been multilevel metallization in which two or more interconnect layers are formed on top of a device, separated by a dielectric layer, and coupled by vias which are filled with a via metallization. Even with multilevel metallization, the reduced area required for vias restricts scaling of interconnect structures. Photolithography technology has advanced so that submicron via windows can be formed but due to contact resistance problems, it has not been possible to take advantage of these advances.

One of the major contributors to the increase in contact resistance is the formation of via veils during the via etching process. In a typical electrical interconnect formation process, a conductor, such as aluminum, is provided on a surface of the semiconductor substrate. An insulating layer is deposited on top of the conductor to cover it, and a photosensitive resist layer is masked on top of the insulating layer. An etchant is then used to pattern the photoresist layer etching through the insulative layer to expose an electrically conductive surface to enable electrical connection to the conductor level. However, during the etching process, the aluminum underlying substrate resputters to form an aluminum oxide that deposits on the sidewalls of the via. This phenomenon is known as a via veil, wherein the redeposition of the oxide causes a micromasking of the via to create a tapering of the via such that the bottom of the via is smaller than the top.

The contact resistance of the via metallization is inversely proportional to the cross-sectional area of the contact at a bottom and a top interface area between the via metallization and the interconnect layers. Effective via metallization must have sufficient contact area at both the bottom and top of the via to provide low resistance contact. However, the via veil formation, which causes a tapered via profile, results in the bottom contact area being smaller than the top contact area which increases contact resistance. In order to compensate, the size of the via must increase or the contact resistance increases. Increasing the size of the via is undesirable in the face of submicron technology because of design requirements and spacing of adjacent via structures. In general the via veil increases the resistance of the interconnect and lowers its conductance and is generally undesirable especially in ultra large scale integration (ULSI) devices.

Alternatively, an organic solvent can be used to remove the aluminum oxide residue along the sidewalls of the via to increase the bottom contact area. However, use of the solvent does not entirely eliminate the aluminum oxide veil. Moreover, the solvent often times attacks the underlying substrate as well as the aluminum oxide, thus causing isotropic undercut of the underlying metal resulting in poor step coverage of the deposited via glue layer. This undercut results in poor via resistance which can lead to reliability failures.

Another contact resistance problem attributable to via veils becomes apparent with unlanded vias. If the mask for the vias is not aligned perfectly with the underlying substrate, the resulting vias are not centered over the conductor layer but are partially unlanded off the conductor. Unlanded vias may contact the conductor layer in both the vertical and horizontal direction due to the alignment tolerance of current photolithographic tools causing the printing of features to be less than optimal such that the etching process partially or completely exposes the conductor in both horizontal and vertical directions. This situation is extremely detrimental when the profile of the via is non-vertical or tapered and size of the via profile is poorly controlled causing parasitic electrical resistance between two connected conductor layers. Poor via resistance has been found to be a major mode of failure for submicron semiconductor devices.

An additional problem encountered in the formation of multilevel interconnects is overetching. When the dielectric layer is etched to form vias, the etchant typically etches at a uniform rate through the material, but the contact depths for multilevel interconnects are necessarily different due to planarization in the underlying topography. Therefore, the conductor level that is closest to the top surface of the dielectric layer is exposed first, but the etching must continue until the other conductors are exposed to form the second level interconnect during which time the etchant continues to act upon the first conductor level. Thus, overetching becomes a problem as the thin first conductor level is undesirably removed during the extended etching causing variability in via size and veil formation.

SUMMARY OF THE INVENTION

One embodiment of the invention provides a method for making a contact opening to an underlying interconnect without forming a via veil. A conductor is formed overlying a first dielectric layer which overlies a semiconductor substrate. Then an etch stop layer overlying the conductor is formed. Next a second dielectric layer is formed overlying the etch stop layer. Then an opening in the second dielectric layer is etched through the second dielectric layer down to the etch stop layer to form an exposed portion of the etch stop layer. The etch stop layer prevents resputtering of the conductor during etching, thus providing the opening with a substantially vertical sidewall profile. Then the exposed portion of the etch stop layer is removed to achieve electrical connectivity with the underlying interconnect.

Another embodiment of the invention provides a method for making a plurality of contact openings to underlying multilevel interconnects without overetching. A first conductor is formed on a first layer overlying a semiconductor substrate. Next a first etch stop layer overlying the first conductor is formed. A first dielectric layer is then formed overlying the first etch stop layer. A second conductor on a second layer overlying a semiconductor substrate is formed. The first and second conductors are vertically offset from each other so that they are on different levels overlying the substrate. A second etch stop layer is formed overlying the second conductor, and a second dielectric layer is formed overlying the second etch stop layer. Then the plurality of openings are concurrently etched with an etchant through the first and second dielectric layers down to the first and second etch stop layers. The first and second etch stop layers prevent overetching of the first and second conductors during the step of forming the openings.

The invention also provides an interconnect structure in a semiconductor device made in accordance with a method of the invention. A conductor overlies a semiconductor substrate. An etch stop layer overlies a portion of the conductor and the semiconductor substrate. A dielectric layer overlies the etch stop layer. The dielectric layer and the etch stop layer have an unlanded contact opening therethrough which exposes a horizontal portion and a vertical portion of the conductor. The contact opening has a substantially vertical sidewall profile to minimize via resistance.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

BRIEF DESCRIPTION OF THE DRAWINGS

Structural elements having like or similar functions are labeled using like reference numerals throughout the various figures accompanying the description.

DETAILED DESCRIPTION OF A PREFERRED EMBODIMENT

Figure 1:
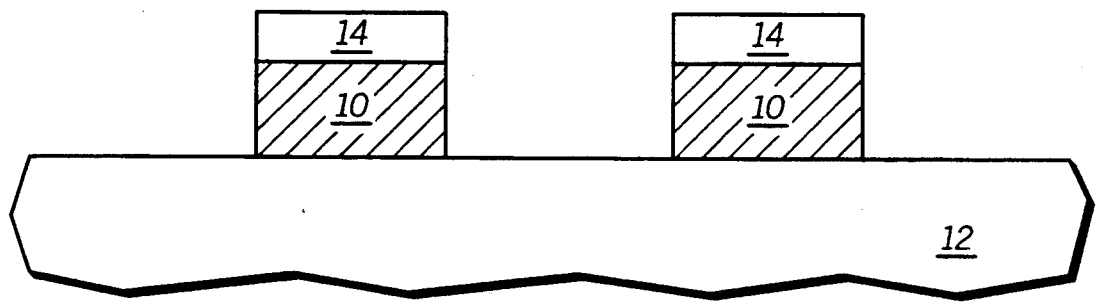
FIGS. 1–3 illustrate, in cross-section, process steps for making contact openings to underlying interconnects in accordance with a first embodiment of the invention.
Figure 2:
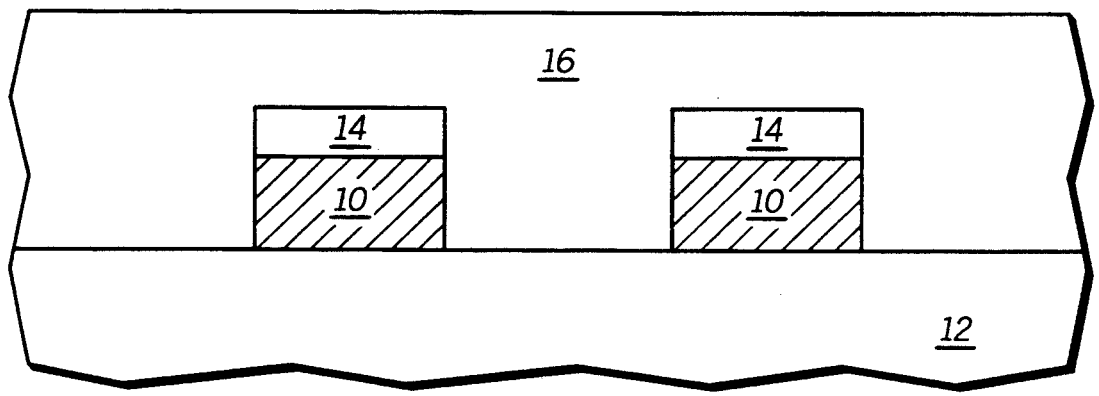
Figure 3:
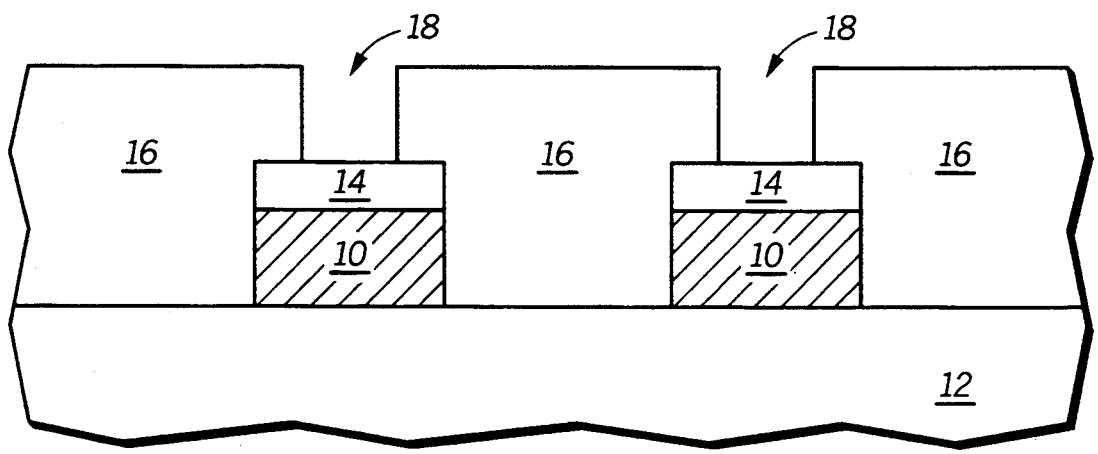

Embodiments of the present invention are now discussed in detail with reference to the figures. FIGS. 1–3 illustrate, in cross-section, process steps for making an interconnect structure in accordance with a first embodiment of the invention. In FIG. 1, conductors 10 are formed overlying a substrate 12. Examples of materials that can be used for the conductors include but are not limited to polysilicon, single crystal silicon, metal silicides, refractory metals, and metal-based interconnects which can include aluminum or aluminum alloy interconnects and copper or copper alloy interconnects. Additionally, any suitable conductive material may be used for the conductors 10. Functionally, the conductors could be a gates for a metal oxide semiconductor field effect transistor (MOSFET), gates or channels of a thin film transistor (TFT), bases or emitters of bipolar or biCMOS devices, or any interconnect layers, such as that for stacked vias. The conductors may be formed using traditional lithography and etching techniques, such as I-Line/Deep UV resist and plasma/RIE etching, respectively. The substrate 12 is typically a deposited dielectric material that overlies a semiconductor substrate, such as silicon or gallium arsenide.

After the conductors 10 are formed, an etch stop layer 14, which can be either a dielectric material or a conductive material, is formed overlying the conductors 10. The etch stop layer 14 can be deposited using conventional deposition equipment known in the art. A plasma enhanced nitride (PEN) deposition source may be used to form the dielectric layer. Low pressure chemical vapor deposition (LPCVD) is generally not recommended due to incompatibility of the deposition temperature and the underlying material. However, if the etch stop material is silicon nitride and the underlying layer is polysilicon, then LPCVD may be used. In this particular instance, LPCVD may be preferable to PEN because the hydrogen gas flow used in PEN equipment can cause hot carrier injection (HCI) problems in the finished device. The etch stop 14 and conductor 10 layers may be simultaneously patterned and sequentially etched using a two step etch. Examples of materials that can be used for the etch stop 14 include but are not limited to silicon nitride, aluminum oxide, tungsten, titanium nitride, and tantalum nitride. The etch stop layer 14 should have a thickness of at least 50 angstroms to be effective, with a preferable practicable range of 100 to 1000 angstroms.

FIG. 2 illustrates a deposition of a dielectric layer 16 overlying the etch stop layer 14. The dielectric layer 16 may be formed by plasma enhanced deposition, high density deposition, or an ozone-based deposition. Dielectric layer 16 fills in any gaps between the conductor stacks to form a relatively smooth top surface. In the event that the top surface topography is irregular or uneven, an optional planarization step may be performed although planarization is not required in practicing the present invention. Examples of materials that can be used for the dielectric 16 include but are not limited to plasma enhanced nitride (PEN), oxynitride, polyimide, spin-on-glass (SOG), tetra ethyl orthosilicate (TEOS), and any number of silicon oxide-based materials.

In FIG. 3, openings 18 are patterned and etched in the dielectric layer 16 down to the conductor stacks. The etch stop layer 14 overlying the conductors 10 stops the etching process to prevent damage or overetch to the underlying layer. A high density plasma source using $C_2F_6$ as the etchant has been found to be particularly effective in performing this etching step due to its selectivity between the dielectric and the underlying etch stop to control the etching. If the underlying conductor 10 is a metal, the etch stop layer 14 also prevents resputtering and redeposition of the conductor on the sidewalls of the openings 18 during the etching step. Thus, the openings 18 have substantially vertical sidewalls resulting from the etching process without needing an organic solvent to remove residue as currently being practiced in the art. Hence, the via veil problem as experienced in the prior art is eliminated by the present invention.

If the etch stop 14 is a conductor, electrical connectivity to the underlying conductor is possible without having to remove the etch stop. However, if the etch stop 14 is a dielectric, an additional etching step is required so that a portion of the conductor is exposed for subsequent electrical contact. A different etchant chemistry from the first etching step is necessary because the etch stop material 14 is by design impervious to the first etchant in order to protect the underlying conductor from overetch during the first etching step. This second etching step may be accomplished using conventional etching techniques by changing the etchant chemistry to one that is selective to the etch stop material.

Figure 4:
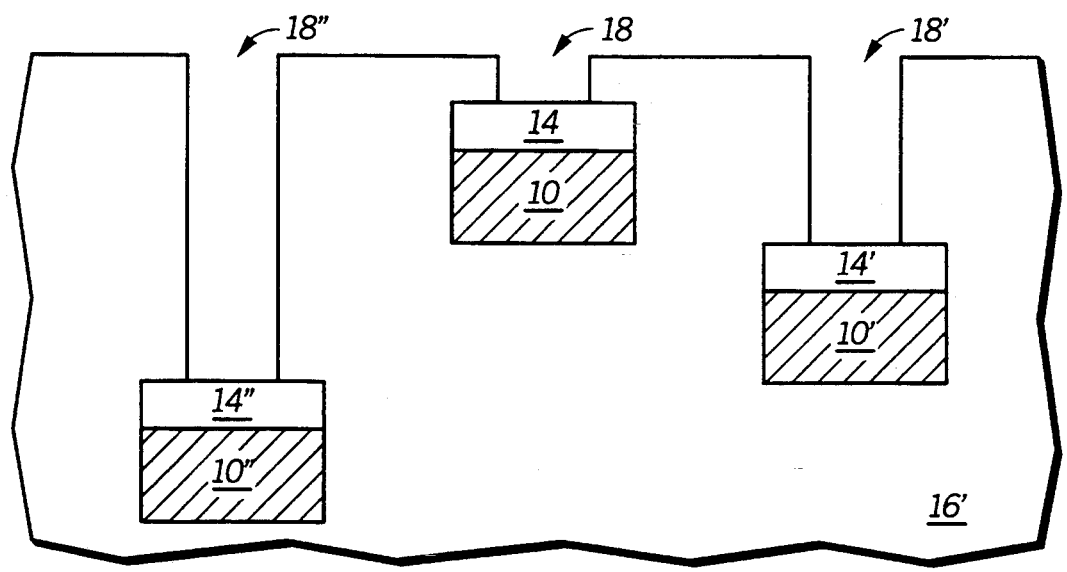
FIGS. 4–5, illustrate, in cross-section, process steps for making contact openings to underlying multilevel interconnects in accordance with a second embodiment of the invention.
Figure 5:
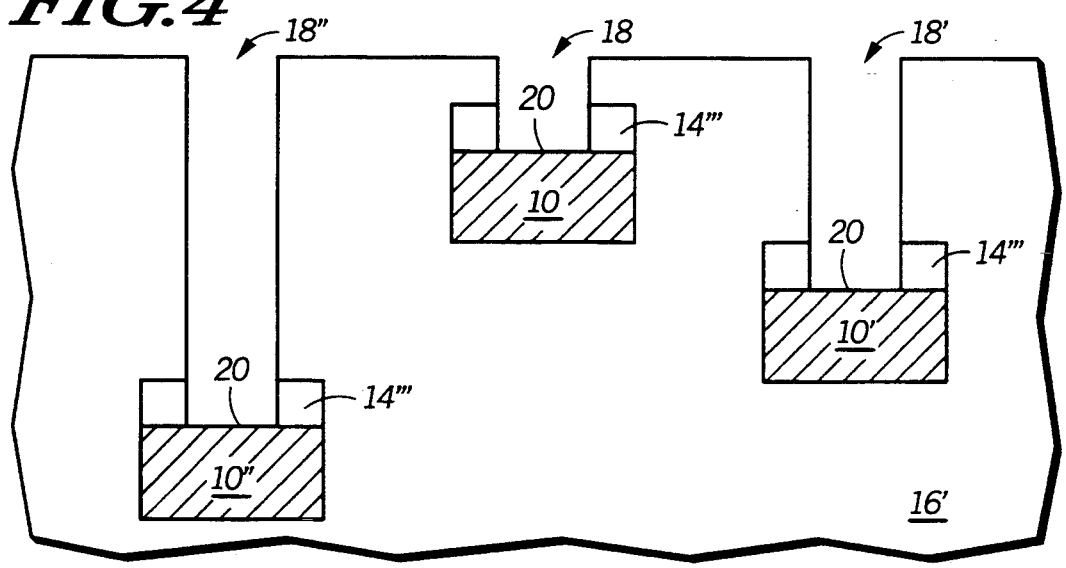

Illustrated in FIGS. 4–5 is an alternative embodiment of the present invention. The materials suitable for the conductors, the etch stop layers, and the dielectrics are the same as those listed previously for the first embodiment. As depicted, the conductors 10, 10' and 10" are on different levels of substrate 16' such that they have different contact depths. The first or lowest level conductor 10" is formed overlying a substrate. The etch stop layer 14" is deposited overlying the conductor to protect the conductor during a subsequent etching step. The conductor and etch stop may be simultaneously patterned and sequentially etched using a two step etch. A dielectric material is then deposited overlying this first level conductor stack. Then a second or higher level conductor 10' is formed overlying the dielectric, and an etch stop 14' is deposited overlying this conductor 10'. Again the conductor and etch stop are patterned and etched. Next another dielectric layer is deposited overlying this second level conductor stack. A third or highest level conductor 10 is formed overlying the last mentioned dielectric, and an etch stop layer 14 is formed overlying this third level conductor 10. This third conductor stack may also be patterned and etched using a two step etch. Then another dielectric layer is deposited overlying the entire structure. In other words, the multilevel conductors and corresponding etch stops are formed sequentially on the substrate. Then the contact openings 18, 18' and 18" are formed in one extended etching step.

Multilevel interconnects have posed a manufacturing problem in the art because of these varying contact depths. During an etching process, the etchant etches at a uniform rate through the dielectric layers. Therefore, the conductor 10 at the highest level is subject to a substantial amount of overetch because the etching must continue until the opening 18" reaches the conductor 10" at the lowest level. However, practicing the present invention eliminates this overetch damage to the conductors regardless of the etch time required. The etch stop layers 14, 14' and 14" protect the underlying conductors by preventing the etchant from reaching the conductors for an indefinite but protracted amount of time. The process window for the etch step is so widened by practicing the present invention that the etch becomes insensitive to underlying topography. Thus, no planarization of the dielectric is required prior to etch. This embodiment of the present invention also shares the advantages of the first embodiment.

After the contact openings are formed through the dielectric down to the multilevel conductor stacks, a different etchant is used to remove a portion of the etch stop overlying each conductor to leave a remaining etch stop portion 14''', as illustrated in FIG. 5. The second etchant has a different chemistry than the first etchant and is chosen for its selectivity with respect to the given etch stop material. The exposed portions 20 of the conductors allow subsequent electrical contact to the underlying conductors. This additional etch stop removal step is not required if the etch stop itself is a conductor because electrical contact to the underlying conductor would already have been possible with the completion of FIG. 4.

Figure 6:
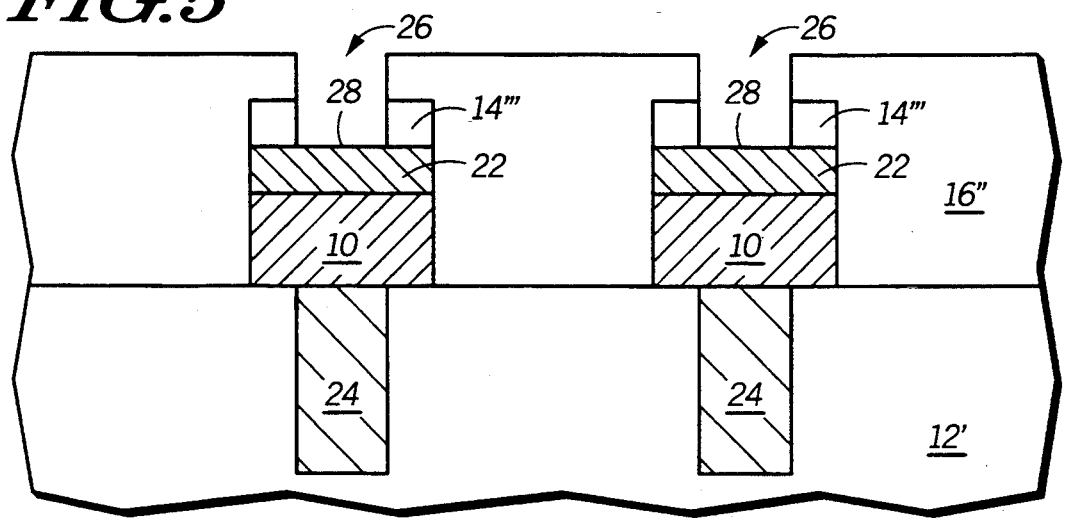
FIG. 6 illustrates, in cross-section, a stacked via interconnect structure in accordance with, a third embodiment of the invention.

FIG. 6 illustrates a third embodiment of the invention in which a stacked via can be formed. Again, the same materials listed previously may be used for the conductors, the etch stop layers, and the dielectrics. As illustrated, the conductor 10 intimately overlies a metal plug 24. Tungsten is typically used to fill vias making them conductive with the underlying conductor. Hence metal plug 24 could be a tungsten filled contact opening made by the teachings of the present invention. A second conductor 22 is formed intimately overlying the first conductor 10. The second conductor 22 can be included in the conductor stack to improve electromigration of thin metal lines or to provide an anti-reflective coating. Examples of materials that would most likely be used for the second conductor include an anti-reflective coating (ARC), tantalum nitride, tungsten, and titanium nitride. However, other conductive materials may also be suitable depending on the application of the interconnect. The contact opening 26 extends through the dielectric layer 16" and the etch stop layer to leave the remaining etch stop portion 14'''. Exposed portion 28 of the second conductor 22 enables electrical contact to the conductor stack in subsequent processing steps. In essence, contact opening 26 could be filled with a metal, such as tungsten, and another conductor layer could be formed above the filled opening. The steps of this embodiment, or any of the other foregoing embodiments, could be repeated to build a set of stacked vias. It should also be noted that although FIG. 6 illustrates two interconnects being on a same level, it is also possible to apply this method of forming stacked vias for multilevel interconnects.

Figure 7:
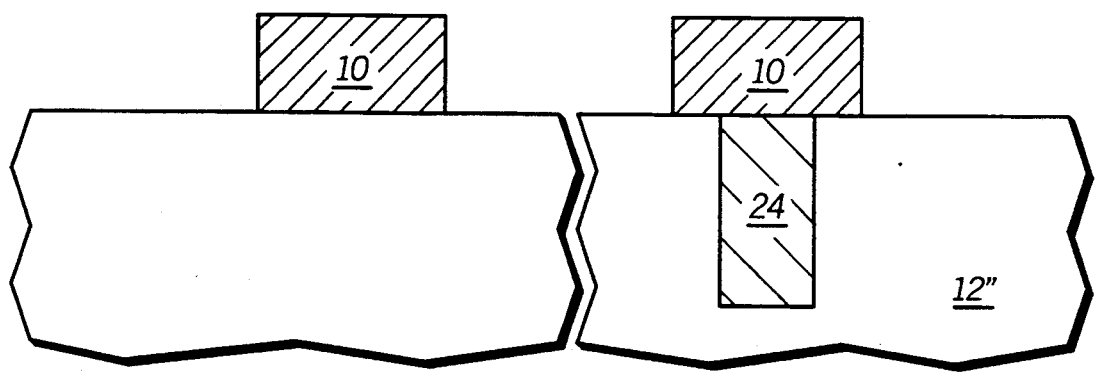
FIGS. 7–12 illustrate, in cross-section, process steps for making a stacked via interconnect structure in accordance with a fourth embodiment of the invention.

FIGS. 7–11 illustrate process steps for making a stacked via interconnect in accordance with a fourth embodiment of the present invention. The figures are split to show different possible applications of the present invention. The materials that can be used for the conductors and dielectrics in practicing this embodiment of the invention are the same as those previously mentioned. The etch stop layer material, however, should be limited to an insulative or dielectric material. Examples of possible etch stop materials for this embodiment can include but are in no way limited to silicon nitride and aluminum oxide. FIG. 7 illustrates conductors 10 overlying substrate 12", wherein the left half of FIG. 7 illustrates a first level conductor 10 simply overlying the substrate while the right half illustrates the conductor 10 intimately overlying a metal plug 24. The left half of the application could be an interconnect without an underlying contact or one with an offset contact. The right half application may have direct underlying contact to either an active or MOSFET device. Both types of applications could simultaneously exist in different areas of the circuitry for the semiconductor device.

Figure 8:
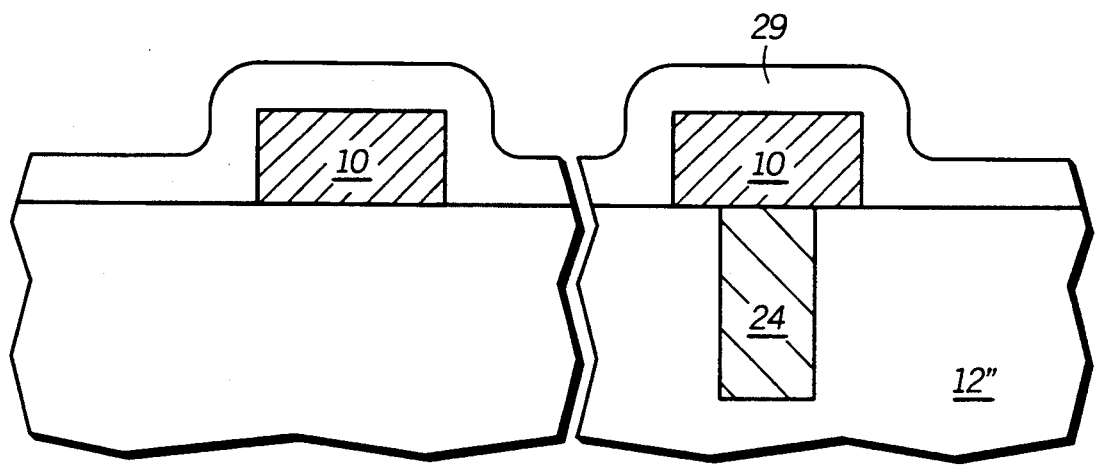
Figure 9:
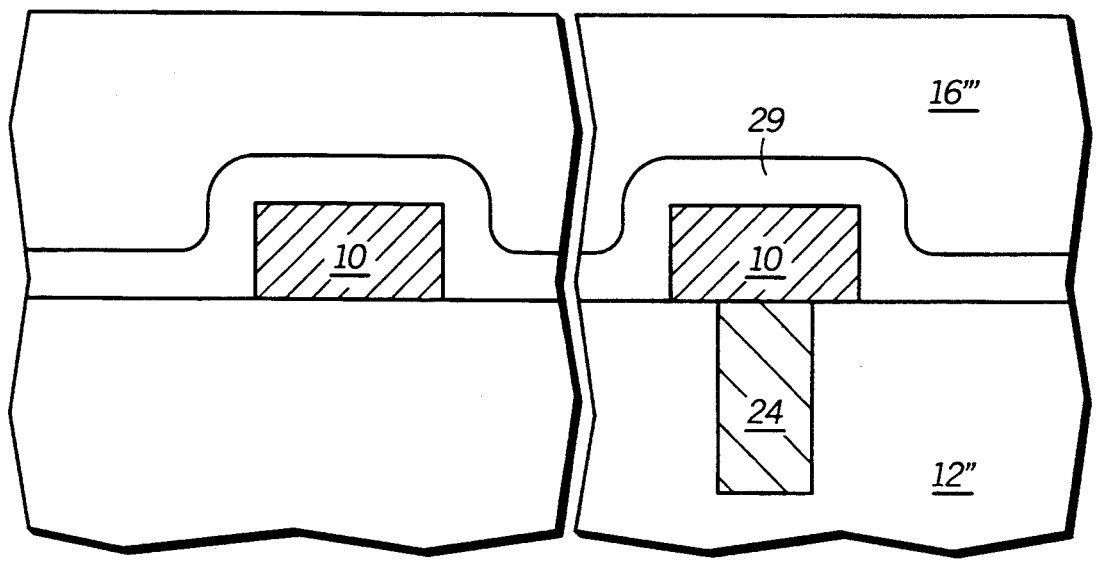

In FIG. 8 the etch stop layer 29 is formed in a blanket deposition step, where the etch stop layer 29 completely overlies both the conductor 10 and the top surface of the underlying substrate 12". The etch stop layer may be either conformal or non-conformal depending on the deposition technique employed. The etch stop material should be nonconductive to prevent a shorting problem between metal lines. The etch stop layer 29 should be at least 50 angstroms thick, with a preferable thickness range of 100 to 1000 angstroms. The dielectric layer 16''' is then formed overlying the etch stop layer 29 as illustrated in FIG. 9. Deposition techniques previously mentioned in conjunction with FIG. 2 are equally applicable in this embodiment.

Figure 10:
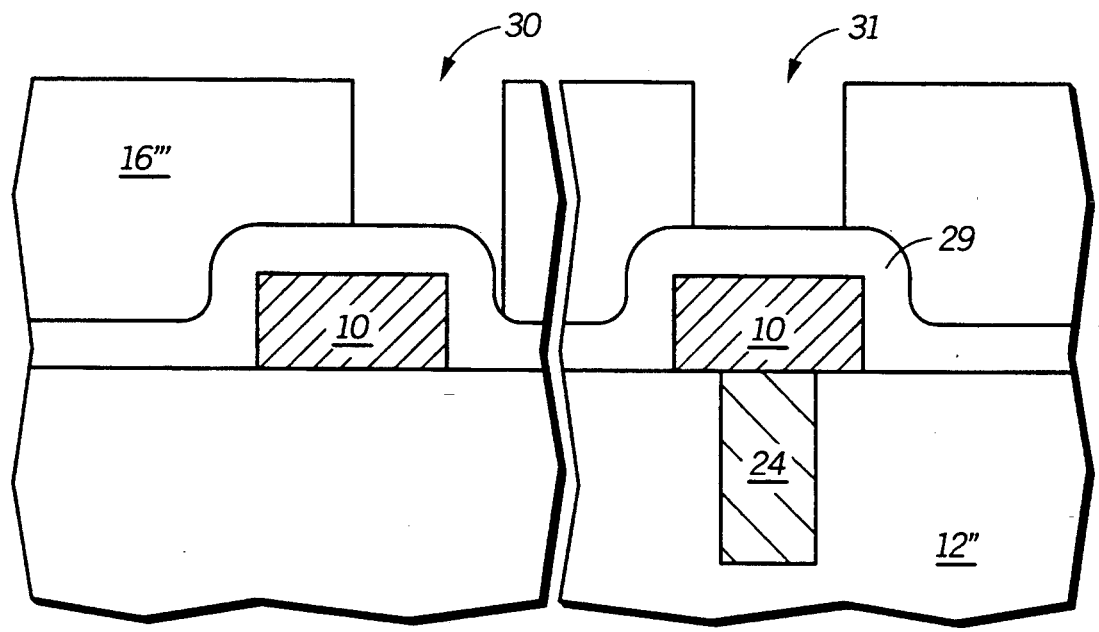

FIG. 10 illustrates the etching step to form the contact openings 30 and 31 which expose portions of the underlying conformal etch stop layer. Opening 30 is unlanded in that it is not squarely centered over the underlying conductor but is instead slightly misaligned, while opening 31 is depicted as a landed opening to show that practice of the present invention is equally applicable to landed and unlanded openings. A vertical portion of the underlying conductor, or a part of its thickness, is potentially exposed with an unlanded opening. An unlanded opening potentially "falls off" the conductor instead of landing squarely atop the conductor and is generally not desirable in the prior art because an unlanded contact opening causes an increase in via resistance by decreasing the contact area. When combined with the via veil problem in the prior art, the increased via resistance often leads to device failure. Thus, it is critical in the prior art to tightly control the alignment tolerances and minimize misalignment during the photolithographic manufacturing process. Tight tolerancing translates into increased cost. However, an advantage to the present invention is that via veils are prevented from forming in the etching process. Moreover, the etch stop layer 29 also protects the underlying substrate 12" from being attacked by the etchant. Therefore, alignment of the etch mask is not critical in practicing the invention so the alignment tolerances may be relaxed to yield a cheaper and more forgiving process. Misalignment can be tolerated such that unlanded openings are formed without unduly increasing the potential for device failure.

Figure 11:
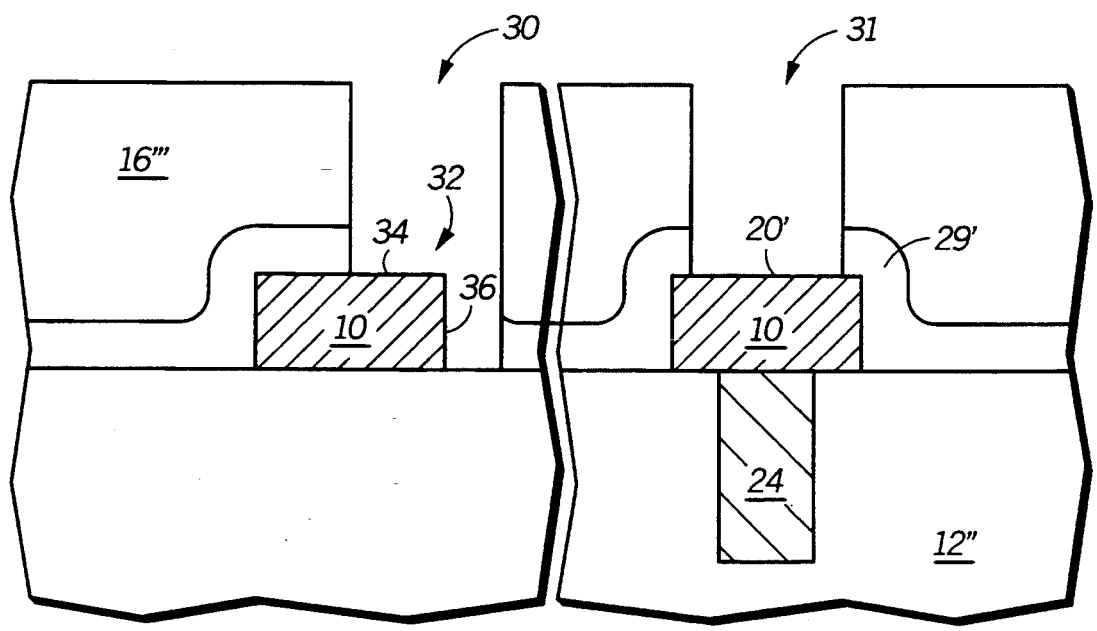

In FIG. 11, a second etchant is used to remove the exposed portions of the etch stop layer to leave a remaining portion 29' of the etch stop layer. Thus, in the case of the unlanded opening 30 as illustrated in the left half of the figure, the exposed portion 32 of the underlying conductor 10 includes not only a horizontal portion 34 of the conductor but also a vertical portion 36 of the conductor; that is, its thickness is partly exposed by the misaligned contact opening. Although FIG. 11 illustrates the entire sidewall of the conductor 10 as being exposed, it should be understood that only a portion of the vertical sidewall needs to be exposed in practicing this embodiment of the invention. The extent of this vertical exposure is dependent on the amount of overetch built into the etching process. As the etch time increases, the amount of vertical sidewall exposure increases to increase the contact area. As illustrated in the right half of the figure, application of the present embodiment is equally appropriate for a landed or centered opening 31. In either the landed or unlanded configurations, since the sidewalls of the contact openings do not have a residue redeposited thereon because the etch stop layer prevents such formation, the cross-sectional area of the opening is maximized to optimize via resistance. Thus, the sidewalls of the contact openings are substantially vertical instead of being tapered.

Figure 12:
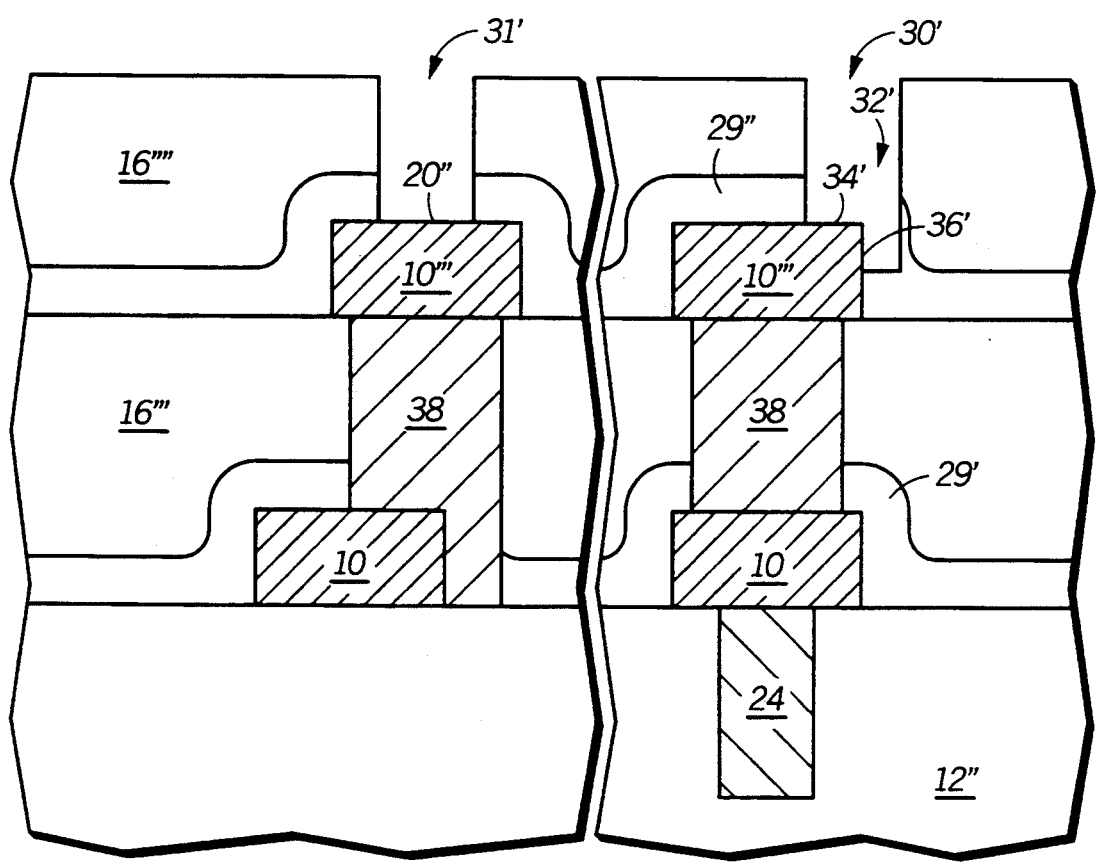

FIG. 12 illustrates an additional stacking of the vias to show that the basic steps of the present invention may be repeated to build and route the interconnects through different levels of a semiconductor device. As can be seen in FIG. 12, the contact openings 30 and 31 are filled with a metal, such as tungsten, to form filled openings 38. Then conductors 10''' are formed intimately overlying the metallized vias or filled openings 38 to form a conductive path between the lower level conductors 10 to the next level conductors 10'''. A second etch stop layer 29'' and a second dielectric layer 16'''' are deposited in accordance with methods disclosed above. Another set of openings 30' and 31' are etched through the dielectric layer 16'''' in accordance with the teachings of this invention. Then another etchant is used in an additional etching step to remove a portion of the etch stop layer 29'' to expose a portion 20'' and 32' of the conductors so that electrical contact may be later established. Exposed portion 32' of the conductors, illustrated in the right half of FIG. 12, has horizontal portion 34' and a vertical portion 36' that are exposed. Some of the etch stop material may remain overlying the substrate at the bottom of the opening 30'. The amount of etch stop material remaining is dependent on the etching time of the process and can be controlled and varied. If desired, all of the etch stop material at the bottom of the opening 30' may be removed during the second etching step in order to increase contact area. The stacking may continue upward as needed as herein described. Although not specifically illustrated, it should be understood that a second conductor, such as an ARC, tantalum nitride, tungsten, or titanium nitride, may be formed intimately overlying the conductors 10 in practicing the invention.

The foregoing description and illustrations contained herein demonstrate many of the advantages associated with the present invention. In particular, it has been revealed that incorporating an etch stop into the formation of an interconnect prevents via veil formation to yield openings with substantially vertical sidewalls. In other words, tapering of the openings is avoided. Thus, via contact resistance is minimized which is critical for device reliability especially in sub-half-micron technology. Moreover, the etch stop layer may either be patterned to align to the underlying conductors or the etch stop layer can be formed in a blanket deposition that covers the entire conductor and underlying substrate surface. Blanket deposition of the etch stop layer allows unlanded vias or openings to be formed without inducing increased via resistance. Yet another advantage is that the present invention enables multilevel interconnects having different contact depths to be formed without causing an overetch of the underlying conductors during the contact opening etching process.

Thus it is apparent that there has been provided, in accordance with the invention, methods for making a contact opening to underlying interconnect or conductor that fully meet the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, this technique is not limited to building individual vias but is intended for stacked via structures which use multilevel interconnection. Therefore, it is intended that this invention encompass all such variations and modifications falling within the scope of the appended claims.

We claim:

1. A method for making a contact opening to an underlying interconnect, comprising the steps of:
   forming a first conductor overlying and abutting a metal plug in a first dielectric layer;
   forming an etch stop layer overlying the first conductor;
   forming a second dielectric layer overlying the etch stop layer;

forming an opening in the second dielectric layer by etching with a first etchant through the second dielectric layer down to the etch stop layer to form an exposed portion of the etch stop layer, wherein the etch stop layer prevents resputtering of the first conductor during etching, thus providing the opening with a proximately vertical sidewall profile;

removing the exposed portion of the etch stop layer to allow subsequent electrical contact with the underlying interconnect;.

filling the opening with a metal to form a filled opening;

forming a second conductor overlying the filled opening;

forming a second etch stop layer overlying the second conductor;

forming a third dielectric layer overlying the second etch stop layer;

forming a second opening by etching with a second etchant through the third dielectric layer down to the second etch stop layer to form an exposed portion of the second etch stop layer, wherein the second etch stop layer prevents resputtering of the second conductor during etching, thus providing the second opening with a proximately vertical sidewall profile; and etching the exposed portion of the second etch stop layer with a second etchant to allow subsequent electrical contact with the second conductor.

2. A method for making a plurality of contact openings to underlying multilevel interconnects, comprising the step of:

forming a first conductor, on a first level, overlying a semiconductor substrate;

forming a first etch stop layer overlying the first conductor;

forming a first dielectric layer overlying the first etch stop layer;

forming a second conductor, on a second level, overlying the semiconductor substrate, wherein the first and second conductors are vertically offset from each other;

forming a second etch stop layer overlying the second conductor;

forming a second dielectric layer overlying the second etch stop layer;

forming the plurality of contact openings by etching with a first etchant through the first and second dielectric layers down to the first and second etch stop layers, wherein the first and second etch stop layers prevent overetching of the first and second conductors; and etching with a second etchant having a different chemistry than the first etchant through the first and second etch stop layers to allow subsequent electrical contact with the underlying multilevel interconnects.

3. The method of claim 2, wherein the steps of forming first and second conductors comprise forming first and second conductors from a material selected from a group consisting of: polysilicon, metal silicide, aluminum alloy interconnect, copper alloy interconnect, refractory metal, and single crystal silicon.

4. The method of claim 2, wherein the steps of forming the first and second etch stop layers are performed by depositing and patterning a material selected from a group consisting of: a dielectric, silicon nitride, aluminum oxide, a conductor, tungsten, titanium nitride, and tantalum nitride.

5. The method of claim 2, wherein the steps of forming the first and second dielectric layers comprise depositing a material selected from a group consisting of: plasma enhanced nitride, silicon oxide-based material, oxynitride, polyimide, spin-on-glass, and tetra ethyl orthosilicate.

* * * * *